(12) United States Patent
Yamayoshi (10) Patent No.: US 7,906,779 B2
(45) Date of Patent: Mar. 15, 2011

(54) THIN FILM TRANSISTOR AND METHOD OF MANUFACTURING THE SAME (75) Inventor: Kazushi Yamayoshi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 135 days.

(21) Appl. No.: 11/946,309

(22) Filed: Nov. 28, 2007

(65) Prior Publication Data

US 2008/0135849 A1 Jun. 12, 2008

(30) Foreign Application Priority Data

Dec. 12, 2006 (JP) ................................. 2006-334703

(51) Int. Cl.
*H01L 29/04* (2006.01)
*H01L 29/10* (2006.01)
*H01L 31/036* (2006.01)
(52) U.S. Cl. ................. 257/57; 257/66; 257/69; 257/72
(58) Field of Classification Search .................... 257/66, 257/69, 72, 57; 438/149
See application file for complete search history.

(56) References Cited

U.S. PATENT DOCUMENTS

| | | | | |
|---|---|---|---|---|
| 5,311,041 | A * | 5/1994 | Tominaga et al. | 257/66 |
| 6,369,410 | B1 * | 4/2002 | Yamazaki et al. | 257/72 |
| 6,569,717 | B1 | 5/2003 | Murade | |
| 7,045,399 | B2 * | 5/2006 | Miyazaki et al. | 438/149 |
| 7,410,839 | B2 * | 8/2008 | Isobe et al. | 438/149 |
| 2004/0164300 | A1 * | 8/2004 | Yamazaki et al. | 257/72 |
| 2006/0145162 | A1 * | 7/2006 | Yang | 257/72 |
| 2007/0001172 | A1 * | 1/2007 | Yu et al. | 257/66 |
| 2007/0148831 | A1 | 6/2007 | Nagata et al. | |

FOREIGN PATENT DOCUMENTS

| | | |
|---|---|---|
| JP | 11-261076 | 9/1999 |
| KR | 2002-0033373 | 5/2002 |
| KR | 10-2006-0075587 | 7/2006 |

OTHER PUBLICATIONS

U.S. Appl. No. 11/948,377, filed Nov. 30, 2007, Takeguchi, et al.

* cited by examiner

*Primary Examiner* — Phat X Cao
(74) *Attorney, Agent, or Firm* — Oblon, Spivak, McClelland, Maier & Neustadt, L.L.P.

(57) ABSTRACT

A thin film transistor includes a polysilicon layer formed over a substrate having a channel region, a source region and a drain region, a conductive layer formed in an upper layer of the polysilicon layer for covering at least a part of the source region and the drain region, an interlayer insulating film formed in a region to cover at least a region including the polysilicon layer, a contact hole formed to penetrate the interlayer insulating film with a depth to expose the conductive layer and a wiring layer formed along a sidewall of the contact hole.

6 Claims, 9 Drawing Sheets

THIN FILM TRANSISTOR AND METHOD OF MANUFACTURING THE SAME

BACKGROUND OF THE INVENTION

1. Field of the Invention

The present invention relates to a thin film transistor formed of low temperature polysilicon formed over an insulating substrate such as a glass substrate and a method of manufacturing the same.

2. Description of Related Art

In display devices such as a liquid crystal display, a thin film transistor (TFT) formed over an insulating substrate such as a glass substrate is used as a switching device of a pixel. When forming a thin film transistor especially with low temperature polysilicon, it is possible to form a circuit for driving a display device at the same time, not only a pixel switching device. This enables to mount the function which used to rely on an external IC (Integrated Circuit) and thereby to improve the reliability and reduce the cost.

Figure 17:
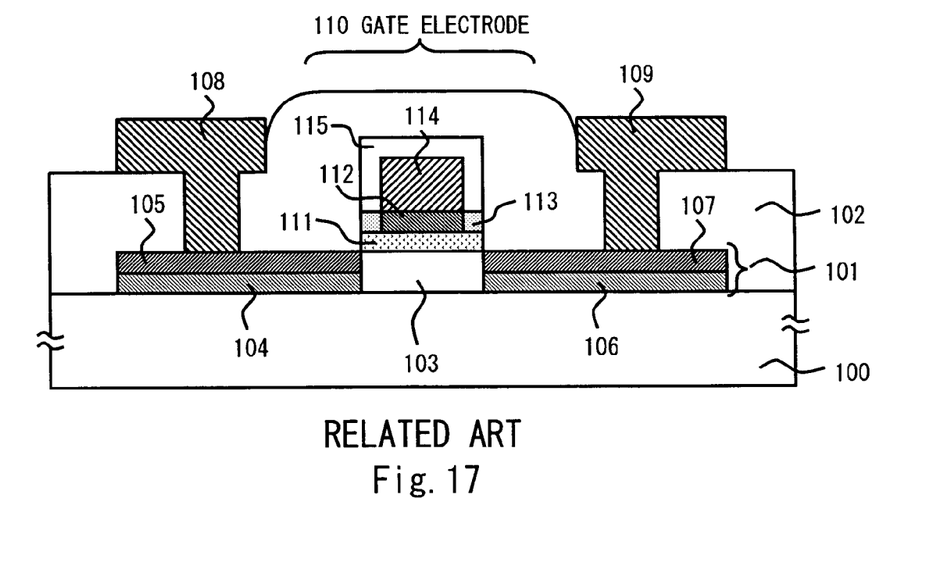
FIG. 17 is a cross-sectional diagram of a TFT device according to the related art.

An example of the structure of the thin film transistor is disclosed in Japanese Unexamined Patent Application Publication No. 11-261076 (hereinafter referred to as a related art). A cross-sectional diagram of the thin film transistor according to the related art is shown in FIG. 17. As shown in FIG. 17, the thin film transistor according to the related art includes a polysilicon layer 101 to be a semiconductor layer. The polysilicon layer 101 has a source region 104 and a drain region 106 which include impurities and are conductive. Moreover, a channel region 103 is formed to the polysilicon layer 101 held between these regions. A gate insulating film 111 is formed to cover the channel region 103. Over the gate insulating film 111 of the channel region 103, a gate electrode 110 formed of an aluminum layer 112, an alumina layer 113, a metal layer 114 and an anodic oxide layer 115 is formed. An interlayer insulating film 102 is formed to cover these layers and a contact hole is formed to the interlayer insulating film 102 located in the upper layer of the source region 104 and the drain region 106, respectively. A source electrode 108 and a drain electrode 109 are electrically connected respectively with the source region 104 and the drain region 106 of the polysilicon layer 101 via these contact holes. Here, as for the thin film transistor disclosed in the related art, the surface of the source region 104 and the drain region 106 (regions 105 and 107) is silicided and the source electrode 108 and the drain electrode 109 are connected to this silicide layer.

Generally, a source region and a drain region desirably have low resistance. Therefore, impurities such as boron or phosphorus are introduced into a polysilicon layer to reduce the resistance of the polysilicon layer. However, even for such a polysilicon layer, the sheet resistance is about several kΩ/□ to several ten kΩ/□, and its resistance value is extremely high compared with a metallic film. Accordingly, in the related art, the resistance value of this source region 104 and the drain region 106 is reduced by siliciding the surface of the source region 104 and the drain region 106.

However, since the silicide layer (the regions 105 and 107) of the thin film transistor according to the related art is very thin, this silicide layer could be reduced by a dry etching in the process of forming the contact holes. Thus there is a problem that due to the reduced amount, a variation is generated in the contact resistance value of the source region 104 and drain region 106, and the source electrode 108 and the drain electrode 109.

SUMMARY OF THE INVENTION

The present invention is made with the background of the above situations, and the purpose of the present invention is to reduce the resistance in the connection portion of the source region and the drain region, and the source electrode and the drain electrode without increasing a photolithography process. Furthermore, the present invention aims at stabilizing the contact resistance value of this connection portion.

According to a first aspect of the present invention, there is provided a thin film transistor that includes a polysilicon layer formed over a substrate having a channel region, a source region and a drain region, a conductive layer formed in an upper layer of the polysilicon layer for covering at least a part of the source region and the drain region, an interlayer insulating film formed in a region to cover at least a region including the polysilicon layer, a contact hole formed to penetrate the interlayer insulating film with a depth to expose the conductive layer and a wiring layer formed along a sidewall of the contact hole.

According to a second aspect of the present invention, there is provided a method of manufacturing a thin film transistor having a polysilicon layer including a channel region, a source region and a drain region formed over a substrate, the method including growing a conductive layer in an upper layer of the polysilicon layer, forming a photoresist film patterned corresponding to a peripheral shape of the polysilicon layer in an upper layer of the conductive layer, where the photoresist film having a thicker film thickness in a region having the source region and the drain region located therein than other regions, forming the polysilicon layer using the photoresist film, removing the photoresist film until a thin film portion of the photoresist film is removed and forming the conductive layer using the polysilicon layer with the thin film portion removed.

The present invention can offer a thin film transistor having a polysilicon layer and a wiring layer connected in low resistance stably without increasing a photolithography process and a method of manufacturing the same.

The above and other objects and features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

First Embodiment

Figure 1:
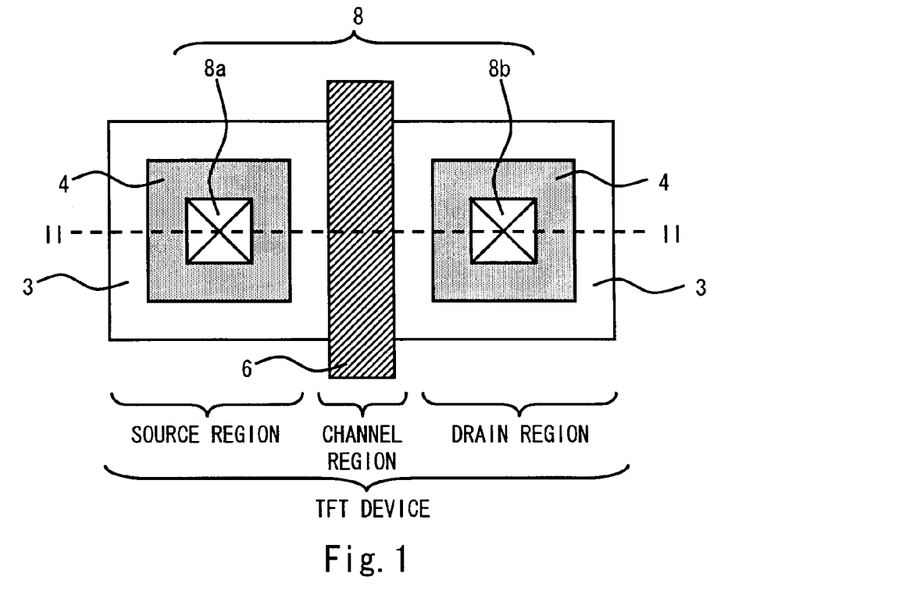
FIG. 1 a plan schematic view of a TFT device according to a first embodiment.

Hereinafter, an embodiment of the present invention is explained with reference to the drawings. The plan schematic view of a thin film transistor (hereinafter referred to as a TFT device) according to this embodiment is shown in FIG. 1. As shown in FIG. 1, the TFT device of this embodiment includes a source region, a drain region and a channel region. The source region and the drain region are regions formed in the polysilicon layer 3. Moreover, the channel region is formed in a polysilicon layer 3 located in the lower layer of a gate electrode 6.

Inside the pattern of the polysilicon layer 3 in which the source region and the drain region are formed, a conductive layer 4 is formed respectively. The conductive layer 4 is formed as a plurality of island like areas formed separately. Moreover, the sum of the areas of the conductive layer 4 formed as a plurality of island like areas is smaller than the sum of the area of the polysilicon layer 3. Furthermore, the edge portion of the conductive layer 4 is formed inside the edge portion of the polysilicon layer 3. Inside the pattern of this conductive layer 4, contact holes 8a and 8b are formed respectively. Here, the cross-sectional diagram of the TFT device taken along the line II-II of the plan schematic view of FIG. 1 is shown in FIG. 2.

Figure 2:
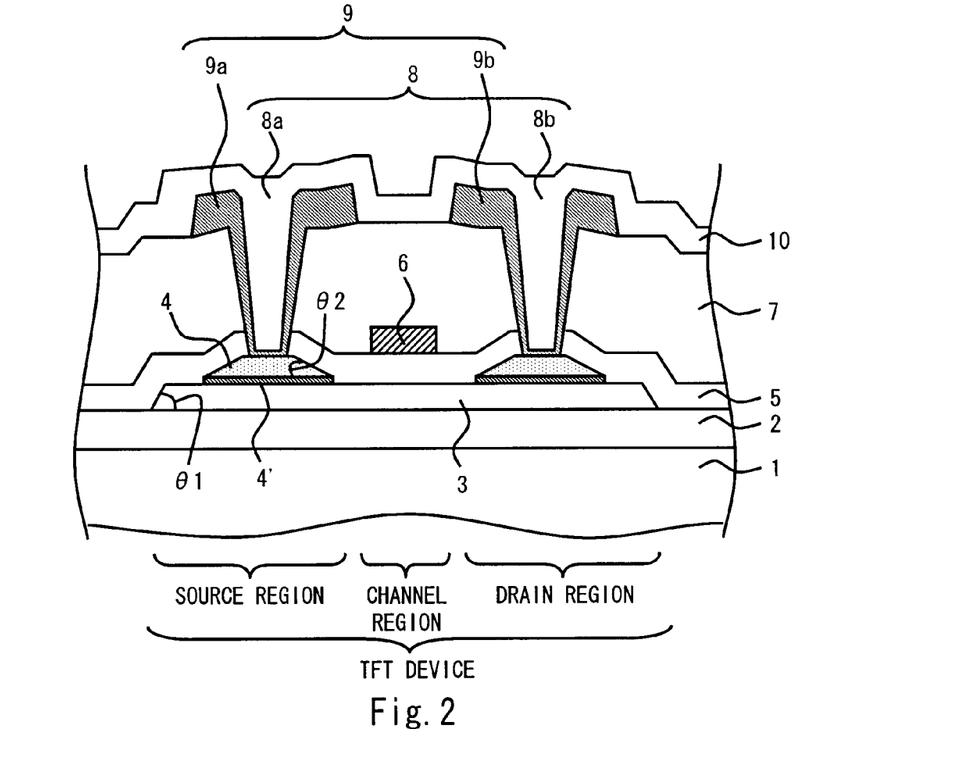
FIG. 2 is a cross-sectional diagram of the TFT device according to the first embodiment.

As shown in FIG. 2, the TFT device according to this embodiment has a barrier layer 2 such as a SiN film and a SiO2 film formed over a glass substrate 1 and the TFT device is formed in the upper layer of this barrier layer 2. The barrier layer 2 serves to prevent mobile ions such as Na from the glass substrate 1 from diffusing to the polysilicon film. The polysilicon layer 3 in which the source region, the drain region and the channel region are formed is formed in the upper layer of the barrier layer 2. The conductive layer 4 is formed over the polysilicon layer 3 surface to be the source region and the drain region. In this embodiment, the conductive layer 4 shall be a molybdenum (Mo) film with a film thickness of 20 nm. Moreover, the edge portion of the conductive layer 4 is formed inside the edge portion of the polysilicon layer 3. Furthermore, in the edge portion of the polysilicon layer 3, the taper angle θ1 formed of the bottom face and the sidewall of the polysilicon layer 3 is 30 to 40 degrees. Then the transistor formed can have good Id/Vg characteristics and transistor characteristics without hump characteristics. Moreover, as for the taper angle θ2 formed of the bottom and the edge portions of the conductive layer 4 is smaller than the taper angle θ1 of the polysilicon layer 3. The taper angle θ2 of this embodiment is 10 to 20.

In addition, in the interface of the conductive layer 4 and the polysilicon layer 3, the surface of the polysilicon layer 3 is silicided at a formation of the conductive layer 4 and the silicide (MoSi) layer 4' for example is formed with a very thin thickness of about 2 nm.

A gate insulating film 5 is formed to cover the polysilicon layer 3 and the conductive layer 4. Furthermore, the gate electrode 6 is formed over the gate insulating film 5 of the channel region. An interlayer insulating film 7 is formed in the upper layer of the gate insulating film 5 and the gate electrode 6 to cover these. The contact holes 8a and 8b (hereinafter collectively referred to as contact hole 8 as appropriate) are formed respectively to the gate insulating film 5 and the interlayer insulating film 7 which are formed in the upper layer of the conductive layer 4 formed in the region where the source region and the drain region are located. These contact holes 8a and 8b are formed to penetrate the gate insulating film 5 and the interlayer insulating film 7 and to expose the surface of the conductive layer 4. In addition, the area of the conductive layer 4 is made larger than the diameter of the contact hole 8. This eliminates the need of high accuracy in positioning the contact holes in a manufacturing process, thereby enabling to achieve high contact accuracy of the conductive layer 4 and a wiring 9 more easily. Note that a contact hole 8c (not shown) over the gate electrode 6 is formed to penetrate the interlayer insulating film 7 to the gate electrode 6 surface.

A source electrode 9a and a drain electrode 9b are formed respectively along the wall surface of the contact holes 8a and 8b located in the source region and the drain region. The source electrode 9a and the drain electrode 9b are electrically connected with the source region and the drain region of the polysilicon layer 3 via the contact holes 8a and 8b and the conductive layer 4. Note that the source electrode 9a and the drain electrode 9b are formed also in the upper layer of the interlayer insulating film 7 near the opening of the contact holes 8a and 8b. Then an insulating film 10 is formed to cover the interlayer insulating film 7, the contact hole 8, the source electrode 9a and the drain electrode 9b.

Next, the manufacturing method of the TFT device according to this embodiment is explained. In the following explanation, the cross-sectional diagram for every manufacturing process of the TFT device is shown in FIGS. 3 to 14. The manufacturing method is explained for every manufacturing process with reference to these drawings.

Figure 3:
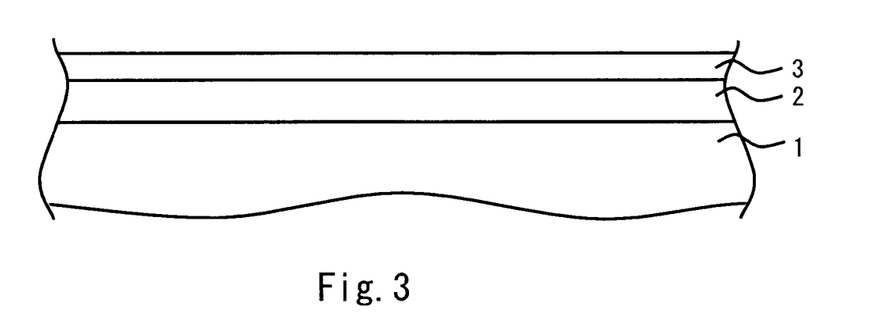
FIG. 3 is a cross-sectional diagram after completing a first process of the TFT device according to the first embodiment.

Firstly, the cross-sectional diagram of the TFT device after completing the first process is shown in FIG. 3. In the first process, the barrier layer 2 such as a SiN film and a SiO2 film and an amorphous silicon to be the polysilicon layers 3 are continuously formed over the glass substrate 1 by CVD (Chemical Vapor Deposition). This prevents contaminants such as boron which exists in atmospheric air from being taken into the surface of the polysilicon layer 3. In addition, it is desirable to place a glass substrate in hot environment after forming the amorphous silicon over the glass substrate and to anneal the amorphous silicon. This is because that the film formed by CVD contains a large amount of hydrogen and for controlling the ablation generated at a crystallization annealing later on. If the amorphous silicon is exposed to the atmosphere, a natural oxidized film is formed to the surface. The natural oxidized film is etched by fluoric acid to be removed. Then, a crystallization annealing is performed to the amorphous silicon. The crystallization annealing is performed by irradiating with an excimer laser beam while spraying nitrogen gas on the amorphous silicon. By this crystallization annealing, the amorphous silicon becomes the polysilicon layer 3. Note that by irradiating with an excimer laser beam while spraying nitrogen gas, it is possible to suppress the projected height generated in a crystal grain boundary and to control the average roughness of the polysilicon layer 3 surface to 5 nm or less.

Figure 4:
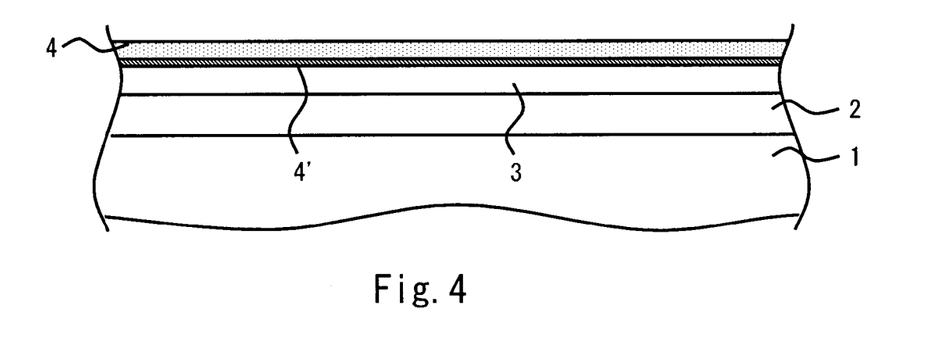
FIG. 4 is a cross-sectional diagram after completing a second process of the TFT device according to the first embodiment.

The cross-sectional diagram of the TFT device after completing the second process is shown in FIG. 4. In the second process, firstly the natural oxidation film of the surface of the polysilicon layer 3 is removed using fluoric acid. Then, the conductive layer 4 is formed in the upper layer of the polysilicon layer 3. In this embodiment, a Mo film is formed with 20 nm film thickness using the sputtering method. At this time, the silicide layer 4' of about 2 nm such as MoSi is formed in the interface of the polysilicon layer 3 and the conductive layer 4.

Figure 5:
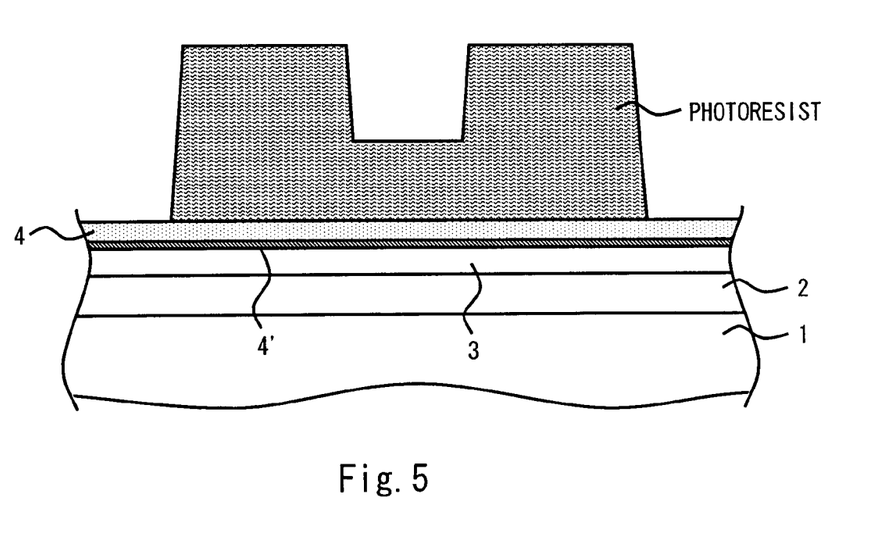
FIG. 5 is a cross-sectional diagram after completing a third process of the TFT device according to the first embodiment.

The cross-sectional diagram of the TFT device after completing the third process is shown in FIG. 5. In the third process, a photoresist corresponding to the shape of the polysilicon layer 3 and the conductive layer 4 to be a TFT device is formed. The photoresist is formed to correspond to the peripheral shape of the polysilicon layer 3, as shown in FIG. 5. Moreover, the photoresist has a region with different film thickness. The shape of the portion with thick film thickness is a region located in the upper layer of the conductive layer 4 or the source and the drain regions and is configured in consideration of the degree of etching in a subsequent process. On the other hand, the thickness of the thin film portion for the photoresist is configured in consideration of how much to leave the thick portion of the photoresist by an etching in a subsequent process.

The photoresist having different film thickness can be formed in one photolithography process using half-exposure technique. A half-tone mask is used in half-exposure technique. The half-tone mask is a mask which uses a transparent mask for the portion not required for photoresist, an opaque mask for the portion to leave with thick film thickness and translucent for the portion to leave with thin film thickness, in case of a positive type photoresist. With the half-exposure technique, it is possible to form the photoresist with desired peripheral shape and film thickness in one photolithography process using such a half-tone mask and controlling the amount of light. Moreover, by using the photoresist formed in this way, it is possible to form a lower layer pattern having the peripheral shape corresponding to the peripheral shape of the photoresist and the upper layer pattern having a different peripheral shape from the lower layer pattern by one sheet of mask and one photolithography process. The peripheral shape of the lower layer pattern at this time corresponds to the shape of the photoresist with thick film portion.

Figure 6:
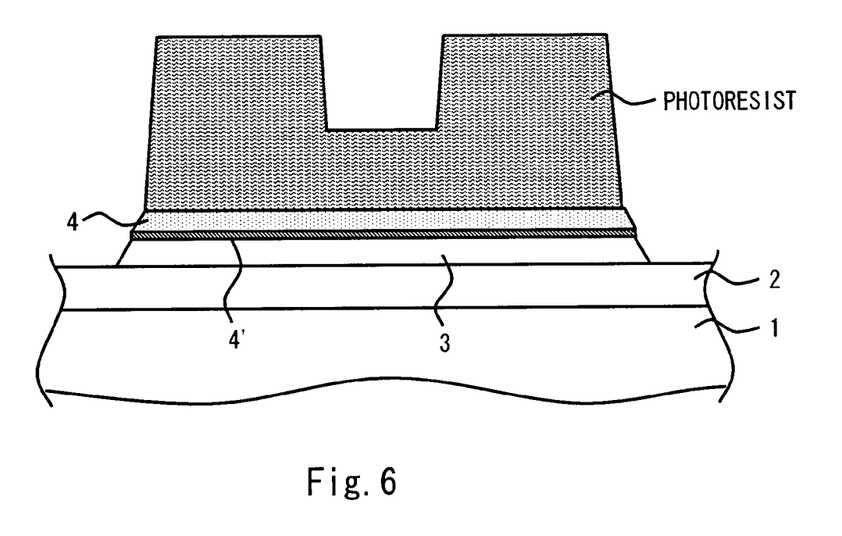
FIG. 6 is a cross-sectional diagram after completing a fourth process of the TFT device according to the first embodiment.

The cross-sectional diagram of the TFT device after completing the fourth process is shown in FIG. 6. In the fourth process, the conductive layer 4, the silicide layer 4' and the polysilicon layer 3 are etched using the photoresist formed in the third process as an etching mask. Here, the pattern of the conductive layer 4 becomes the same pattern as the desired pattern of the polysilicon layer 3. Then, the polysilicon layer 3 is etched by mixed gas of CF4 and O2. By mixing O2, the etching is performed while retreating the photoresist, thus the sidewall of the polysilicon layer 3 has tapered shape. Moreover, since the conductive layer 4 is a Mo film, the conductive layer 4 is also etched. Therefore, the conductive layer 4 will not have the shape projected from the polysilicon layer 3 but have the sidewall having tapered shape which is almost same as the polysilicon layer 3. Thus, the taper angle of the polysilicon layer 3 can be controlled by O2 flow rate. Particularly, the channel region is controlled so that the taper angle of the polysilicon layer 3 to be 30 to 40 degrees. Moreover, the shape of the photoresist by which a half-exposure is performed has a small taper angle, however it is controlled not to be 30 or less by a half-tone process.

Figure 7:
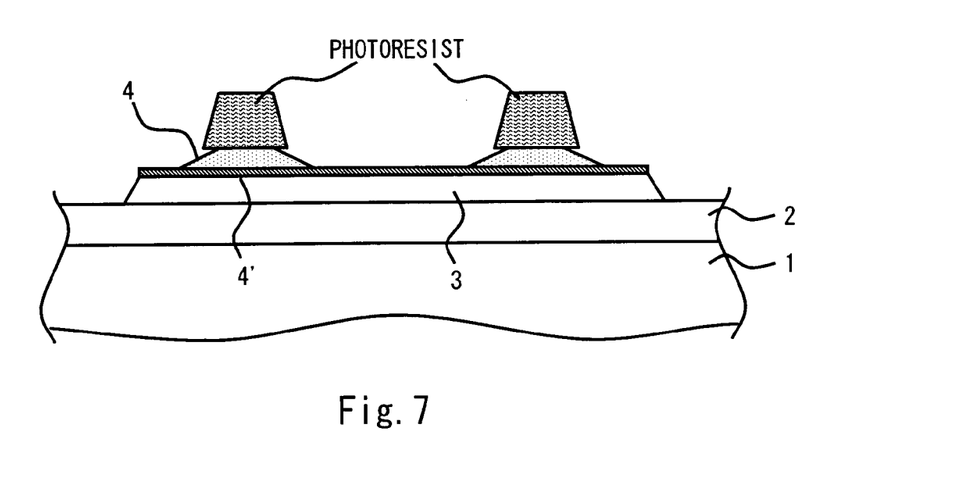
FIG. 7 is a cross-sectional diagram after completing a fifth process of the TFT device according to the first embodiment.

The cross-sectional diagram of the TFT device after completing the fifth process is shown in FIG. 7. In the fifth process, an ashing process is performed so that the thin film portion of the photoresist is completely removed. Then only the source region and the drain region where the photoresist has thick film thickness are left. At this time, as the sidewall portion of the photoresist is also ashed, the sidewall retreats. This makes the area of the photoresist small. Then the conductive layer 4 is etched using the remaining photoresist as a mask. The etching in this case is a wet etching and the taper angle of the conductive layer 4 is about 20. Then, the pattern of the conductive layer 4 of the source region and the drain region has the area reduced for the photoresist retreat by the ashing and the side etching by the wet etching as compared with the pattern of the photoresist before the ashing.

Figure 8:
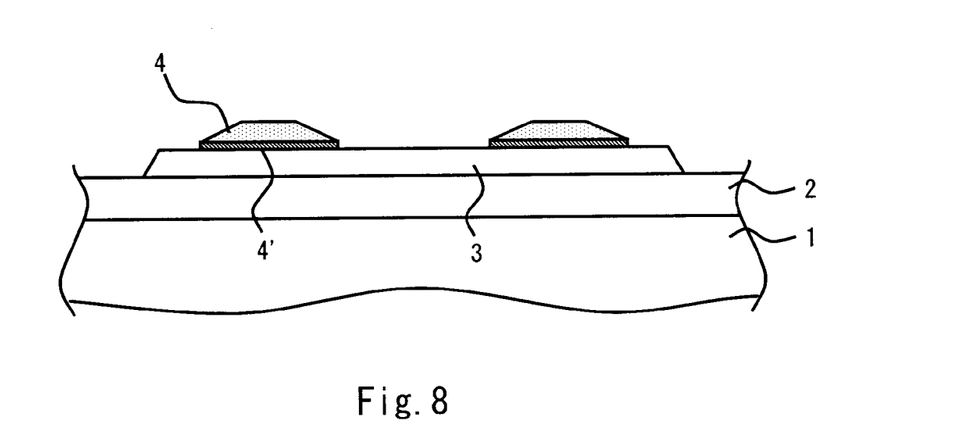
FIG. 8 is a cross-sectional diagram after completing a sixth process of the TFT device according to the first embodiment.

The cross-sectional diagram of the TFT device after completing the sixth process is shown in FIG. 8. In the sixth process, the photoresist used in the fifth process and the silicide layer 4' remaining after fifth process are removed. In the etching of the sixth process, fluorine etching gas (for example CF4) is used. Then the surface of the polysilicon layer 3 is reduced. In this embodiment, the amount of the reduction at this time is 10 nm or less.

Figure 9:
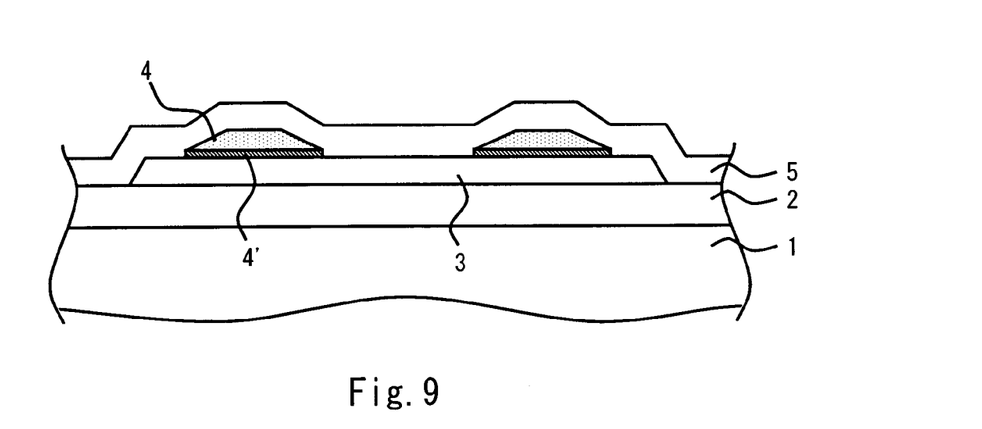
FIG. 9 is a cross-sectional diagram after completing a seventh process of the TFT device according to the first embodiment.

The cross-sectional diagram of the TFT device after completing the seventh process is shown in FIG. 9. In the seventh process, the gate insulating film 5 is formed to cover the polysilicon layer 3 and the conductive layer 4. In this embodiment, a SiO2 film is formed by CVD as the gate insulating film 5. Moreover, in this embodiment, the film thickness of the gate insulating film 5 is 70 nm to 100 nm.

Figure 10:
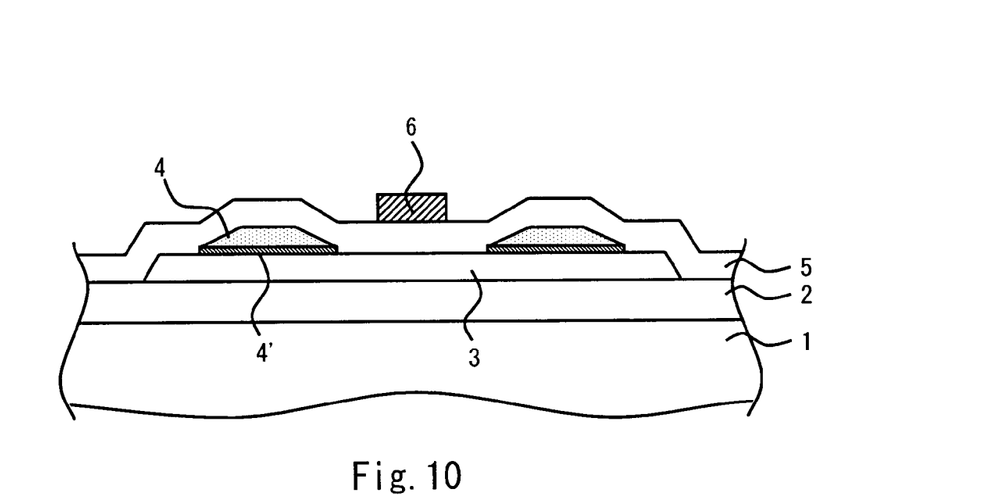
FIG. 10 is a cross-sectional diagram after completing an eighth process of the TFT device according to the first embodiment.

The cross-sectional diagram of the TFT device after completing the eighth process is shown in FIG. 10. In the eighth process, firstly a conductive film to be the gate electrode 6 is formed so that film thickness may be 20 nm for a Mo film. Then the photoresist is formed to be a desired pattern according to the outline shape of the gate electrode 6 in a photolithography process and an etching is performed using the photoresist as a mask. Then the gate electrode 6 is formed as shown in FIG. 10.

Figure 11:
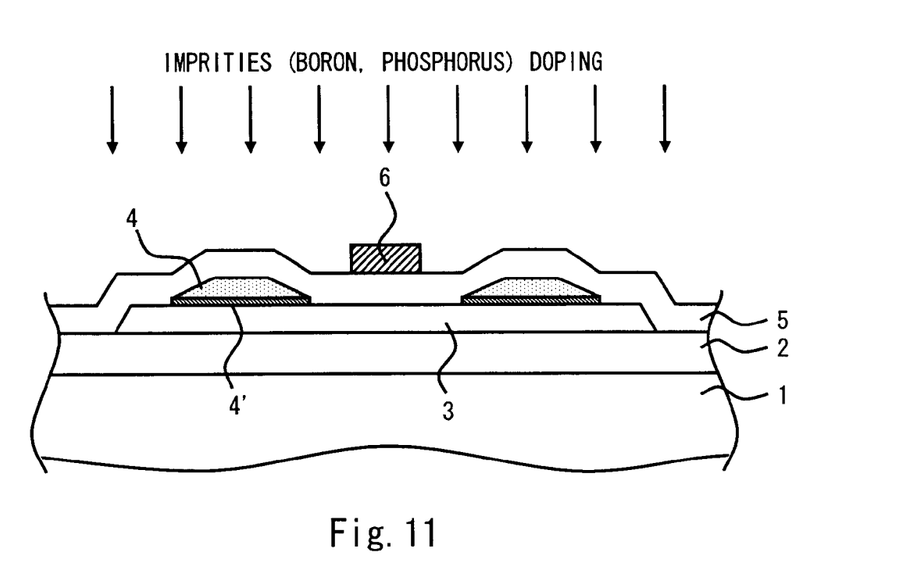
FIG. 11 is a cross-sectional diagram after completing a ninth process of the TFT device according to the first embodiment.

The cross-sectional diagram of the TFT device after completing the ninth process is shown in FIG. 11. In the ninth process, when forming a TFT device of PMOS characteristics, impurities of boron are injected into the polysilicon layer 3 through the gate insulating film 5 by ion implantation. In the channel region of the polysilicon layer 3, since the conductive film of the gate electrode 6 is to be a mask, impurities are not introduced into the polysilicon layer 3 of this region. As there is the conductive layer 4 in the source region and the drain region, which is very thin, the impurities penetrate the conductive layer 4 and are injected into the polysilicon layer 3. On the other hand, when forming a TFT device of NMOS characteristics, phosphorus is injected into the polysilicon layer 3 in the same way as boron. By injecting the impurities also under the conductive layer 4, it is possible to definitely obtain ohmic characteristics in the portion between the channel and drain regions and channel and drain regions. Moreover, in terms of reliability of a TFT device, a TFT device desirably has a LDD (Lightly Doped Drain) structure. With the LDD structure, by changing the width of the gate electrode 6, it is possible to form a region where high-concentration phosphorus is applied and a region where low-concentration phosphorus is applied.

Figure 15:
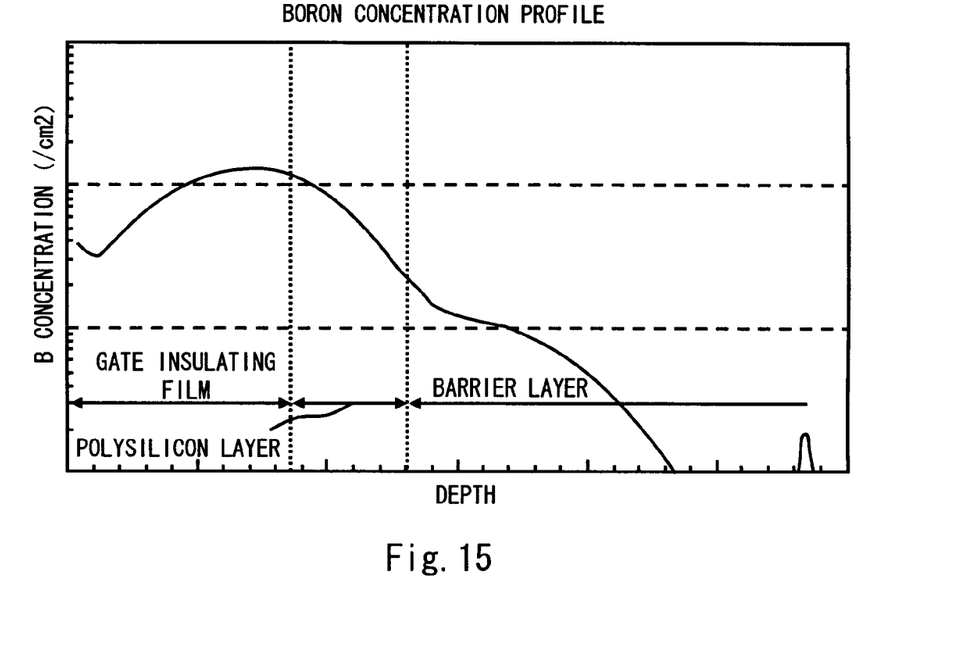
FIG. 15 shows the boron concentration profile in a polysilicon layer of the TFT device according to the first embodiment.
Figure 16:
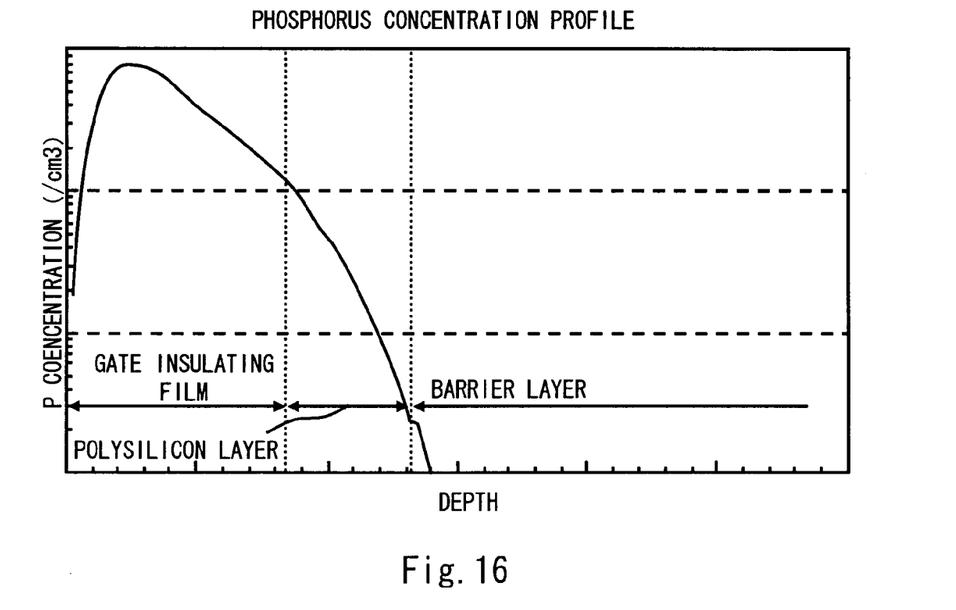
FIG. 16 shows the phosphorus concentration profile in the polysilicon layer of the TFT device according to the first embodiment.

In this embodiment, ion implantation is performed with an electric field strength of about 70 keV and a dose amount of 1E15/cm$^2$ for boron and for phosphorus, about 70 keV and 2E15/cm$^2$. Moreover, in this embodiment, although the film thickness of the conductive layer 4 is set to 20 nm, it is not a problem up to about 25 nm under this condition. SIMS is used for the evaluations to check the impurity concentration profile in the film. Here, the concentration profile of boron and phosphorus in this embodiment is shown in FIGS. 15 and 16.

Furthermore, when a TFT device of the CMOS structure that PMOS and NMOS are intermingled is required, such a structure can be realized by forming a gate electrode for PMOS and a gate electrode for NMOS in 2 steps.

Figure 12:
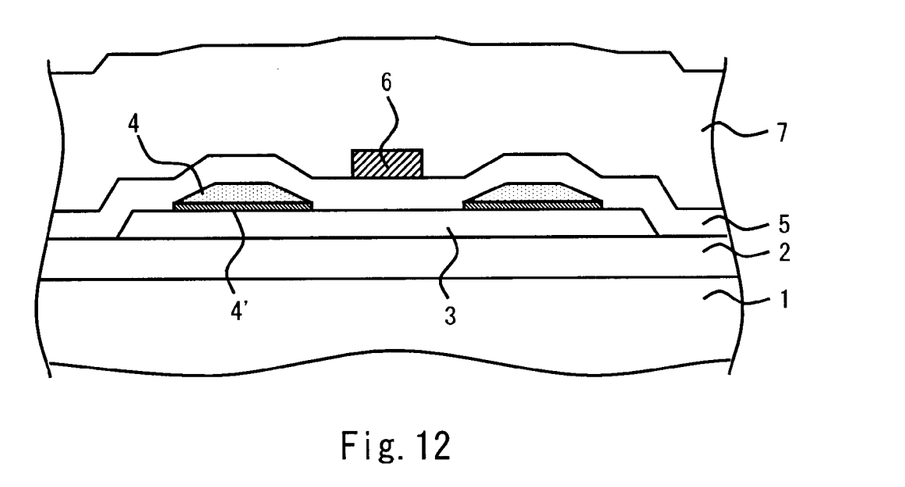
FIG. 12 is a cross-sectional diagram after completing a tenth process of the TFT device according to the first embodiment.

The cross-sectional diagram of the TFT device after completing the tenth process is shown in FIG. 12. In the tenth process, the interlayer insulating film 7 is formed to have the film thickness of about 500 to 1000 nm and to cover the region which at least includes the polysilicon layer 3. In addition, the interlayer insulating film 7 is formed in the upper layer of the gate insulating film 5 formed in the upper layer of the gate electrode 6 and the conductive layer 4. Moreover, it is desirable to deposit the interlayer insulating film 7 500 nm or more if interlayer insulating film 7 is SiO2, for the purpose to reduce cross capacitance between the wiring 9 and the gate electrode 6 which are formed later on.

Figure 13:
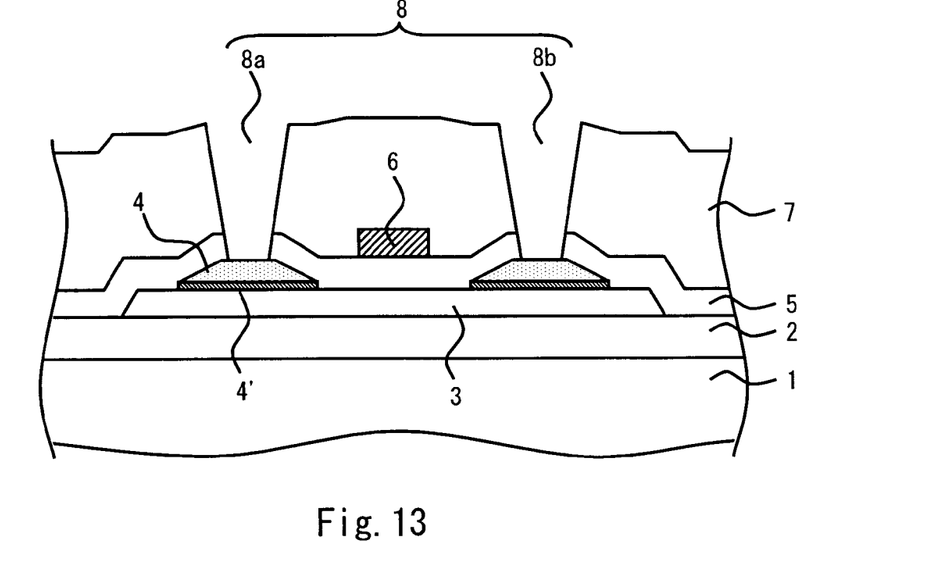
FIG. 13 is a cross-sectional diagram after completing an eleventh process of the TFT device according to the first embodiment.

The cross-sectional diagram of the TFT device after completing the eleventh process is shown in FIG. 13. In the eleventh process, the contact holes 8a and 8b are formed in the upper part of the conductive layer 4. For example, the contact hole 8a is formed to be located over the source region and the contact hole 8b is formed to be located over the drain region. From the surface of the interlayer insulating film 7, the contact hole 8 penetrates the interlayer insulating film 7 and the gate insulating film 5 and is formed in the depth to expose the conductive layer 4. The contact hole 8 is formed by providing an opening in the region corresponding to the opening part of the contact hole in the photoresist by a photolithography process and etching the interlayer insulating film 7 and the gate insulating film 5. In addition, although not shown, the contact hole 8c to the gate electrode 6 is also formed over the gate electrode 6 as with the contact holes 8a and 8b.

Figure 14:
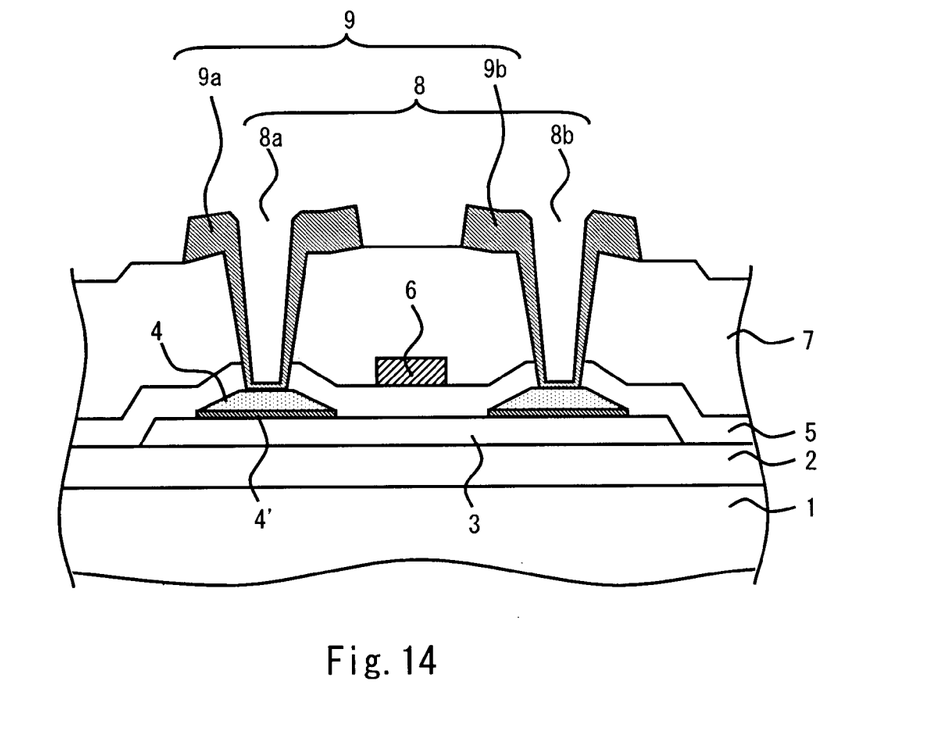
FIG. 14 is a cross-sectional diagram after completing a twelfth process of the TFT device according to the first embodiment.

The cross-sectional diagram of the TFT device after completing the twelfth process is shown in FIG. 14. In the twelfth process, the wiring 9 is formed along the wall surface of the contact hole 8 formed in the eleventh process. Here, the wiring 9 formed in the contact hole 8a is referred to as the source electrode 9a and the wiring 9 formed in the contact hole 8b is referred to as the drain electrode 9b. In this embodiment, laminated structure of Mo/Al/Mo is used for the conductive film to be the wiring 9. Note that this conductive film may be Mo, Cr, W, Al, Ta or an alloy film mainly using these. The wiring 9 is formed using the sputtering method and for example the film thickness of an Al film is 200 to 400 nm and the film thickness of a Mo film formed in the region between the Al films is 50 to 150 nm. After that, a photoresist is formed using a photolithography process. The photoresist is formed so that wiring 9 may remain in the contact hole 8 and near the opening of the contact hole 8. Then the wiring 9 is formed to be a desired pattern by a dry etching using the mixed gas of SF6 and O2 and the mixed gas of Cl2 and Ar.

After the twelfth process is completed, the insulating film 10 is formed as passivation. The insulating film 10 is formed by forming a SiN film, for example. Then, the film held for one hour in an annealing oven heated at 450 degree Celsius in a nitrogen atmosphere. This activates the impurities introduced into the source/drain regions of the polysilicon layer 3. After the annealing process is completed, a desired portion is opened in the insulating film 10 by a photolithography process and an etching to wire transparent conductive film such as ITO and IZO.

For a liquid crystal display, an array substrate process is until forming a transparent conductive film such as ITO and IZO as a pixel electrode. However the explanation is omitted here. Moreover, although only the TFT device region has been explained as a mode of the present invention, explanation is omitted for patterns of electrodes, wirings and contact holes other than this.

When forming the contact hole 8, in order to prevent contact failure by insufficient etching, generally an etching condition is made into over etching. In related arts, the wiring or the electrodes are formed without having the conductive layer 4 in the upper layer of the polysilicon layer, thus in the etching process to form the contact hole for forming the wiring 9, the polysilicon layer may be reduced more than expected.

Moreover, the source region and the drain region of the polysilicon layer 3 are formed by ion implantation. In such ion implantation, impurity concentration shows variation in the depth direction of the polysilicon layer. In the example according to this embodiment, as shown in the graph of FIGS. 15 and 16, the deeper the depth of the polysilicon layer 3, the lower the impurity concentration. As for the polysilicon layer, the higher the impurity concentration, the smaller the resistance value. That is, the polysilicon layer tends to have larger resistance value as it gets deeper. Thus, with the structure of the TFT device according to the related art, when the polysilicon layer is reduced more than expected, there has been a problem that a variation is generated in the contact resistance of the source and the drain regions with the wiring.

On the other hand, in the TFT device of this embodiment, as the contact hole 8 is formed in the upper layer of the conductive layer 4, the conductive layer 4 functions as a stopper. Therefore, the polysilicon layer 3 is not etched. Accordingly, the TFT device of this embodiment can stabilize the contact resistance of the source and the drain regions with the wiring 9 in low resistance.

Moreover, the TFT device according to this embodiment connects the source and the drain regions formed in the polysilicon layer 3 with the wiring 9 through the conductive layer 4 formed in the upper layer of the polysilicon layer 3. Then since the conductive layer 4 is formed with Mo or a metal which mainly uses Mo, the conductive layer 4 and the polysilicon layer 3 are connected by low resistance through the silicide layer 4. This brings an advantageous effect that the wiring 9 has good contact resistance with the conductive layer 4.

Furthermore, in the manufacturing method of the TFT device according to this embodiment, the peripheral shape of the polysilicon layer 3 and the conductive layer 4 is formed in one photolithography process using a half-tone mask. In related arts, for patterns having different shapes, the photolithography process has been required for each of the patterns. That is, it is possible to eliminate this photolithography process in the manufacturing method of the TFT device according to this embodiment. Moreover, as the photolithography process can be reduced, the number of masks to be used can also be reduced.

Note that the present invention is not limited to the above embodiments, but may be modified and changed without departing from the scope and spirit of the invention. For example, although the first embodiment explained the TFT device, in a liquid crystal display, there is the polysilicon layer 3 having low resistance in one of the electrodes of a retention capacity device and a part of the polysilicon layer 3 may be used as a wiring. It is also possible to form such region simultaneously with the TFT device region.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin film transistor comprising:
   a polysilicon layer formed over a substrate having a channel region, a source region and a drain region;
   a conductive layer formed in an upper layer of the polysilicon layer for covering at least a part of the source region and the drain region;
   a gate insulating film formed in a region to cover at least a region including the polysilicon layer and the conductive layer;
   a contact hole formed to penetrate the gate insulating film with a depth to expose the conductive layer; and
   a wiring layer formed along a sidewall of the contact hole,
   wherein a first edge portion of the conductive layer is tapered at an angle of 10 to 20 degrees with respect to a bottom surface of the conductive layer, the first edge portion being formed inside a second tapered edge portion of the polysilicon layer, the second tapered edge portion being tapered at an angle of 30 to 40 degrees with respect to a bottom surface of the polysilicon layer.

2. The thin film transistor according to claim 1, further comprising a silicide layer in an interface of the polysilicon layer and the conductive layer.

3. The thin film transistor according to claim 1, wherein the conductive layer has a plurality of island like areas formed separately in an upper layer of the polysilicon layer and a sum of areas of the plurality of island like areas is smaller than an area of a region having the polysilicon layer formed therein.

4. The thin film transistor according to claim 1, wherein the conductive layer has a larger area than an area of a bottom face of the contact hole and the wiring layer is electrically connected with the conductive layer via the contact hole.

5. The thin film transistor according to claim 1, wherein the conductive layer is molybdenum or an alloy film mainly using molybdenum.

6. A display device having the thin film transistor according to claim 1.

* * * * *